Oct. 9, 1962 M. CALVIN ET AL 3,057,947
PHOTOELECTRIC CELL USING ORGANIC MATERIALS
Filed Oct. 1, 1959
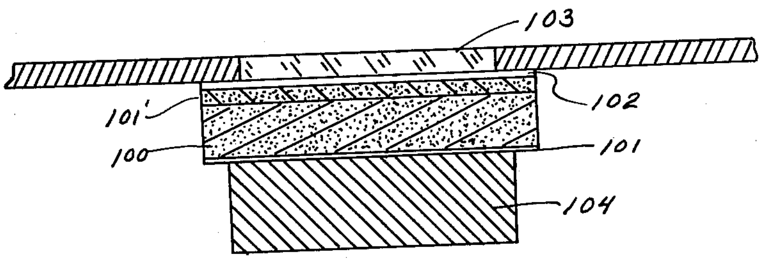
INVENTORS
MELVIN CALVIN +
DAVID R. KEARNS
BY Thomas G. Graham
ATTORNEY United States Patent Office 3,057,947

Patented Oct. 9, 1962

3,057,947

PHOTOELECTRIC CELL USING ORGANIC MATERIALS

Melvin Calvin, 2683 Buena Vista Way, and David Richard Kearns, 1863 La Loma Ave., both of Berkeley, Calif.

Filed Oct. 1, 1959, Ser. No. 843,876
9 Claims. (Cl. 136—89)

This invention relates to the formation of a solar battery from organic materials, suitable for conversion of energy from the sun into useful electricity.

The practical achievement of the conversion of illumination to electrical energy has received much attention since the discovery of the 1930's that the p-n junction, or boundary between different electrical conductivity types in a semiconductor crystal, was photosensitive; consequently the several methods and materials by which to accomplish this conversion efficiently are currently being intensely investigated. All of the materials which have received any prominence as semiconductors for either research or practical applications have so far been either elements such as germanium and silicon, or inorganic compounds such as cuprous oxide, cadmium sulfide and gallium arsenide, and attempts to produce a photovoltage in solid organic materials have heretofore met with very little success. Part of this difficulty in securing suitable organic materials is due to those properties of a typical organic compound which either completely negate the possibility of electron transfer through the organic material or prevent it at temperatures below the decomposition point of the organic crystal. These properties which frustate electronic conductivity in almost all organic materials are very weak intermolecular bonding and, if present at all, narrow and widely spaced electron bands.

Most attempts to produce electronic conductivity in organics have centered on resonance structures, of which the benzene bond due to shifting back and forth of single and double bonds at high frequency, permits the motion of electrons around the ring, and it has been postulated that if this resonance path were very long, as in polynuclear aromatic structures, electronic conductivity could then be realized. This effect has already been produced to some extent in certain dyes, notably phthalocyanin metal complexes, but only at highly elevated temperatures which are unattainable for present practical usage. It is obvious, then, that the outlook for developing organic compounds as semiconductors similarly to inorganic compounds has been believed to be far from favorable.

It is an object of this invention to provide an organic cell responsive to illumination.

It is another object of this invention to provide an organic polycrystalline photoelectric cell.

It is a further object of this invention to provide an inexpensively produced organic system which produces an electric potential on exposure to visible light, ultra violet or near infra-red radiation.

It is still another object of this invention to provide an organic system which acts as a sensitive light detecting device by the production of a voltage on exposure to light.

Other objects and advantages of the invention will in part be obvious and in part appear hereinafter.

We have discovered, however, that by the proper combination of certain organic compounds a successful organic photocell may be prepared which is capable of creating a photovoltage in response to illumination, thus providing a system for use as a solar battery or as a photosensitive circuit element. The organic photocell of this invention is considerably more economical than the presently know inorganic and elemental semiconductors now under development due both to the wider variety of starting materials which may be used and to ease of manufacture. Whereas nonorganic semiconductors must be grown as single crystals and have precisely distributed within them a predetermined amount of impurities in order to create the photosensitive p-n junction, the organic photocell herein described is a polycrystalline system, the manufacture of which is not dependent on delicate crystal growth conditions, and in which photosensitivity is achieved without predetermined impurity dispersion.

In general this organic photocell may be described as a two component system comprised of a first elecron transferring material held in intimate contact with a second substance which is either an electron donor or electron acceptor. By illuminating this system so as to cause light to pass through the second material and fall upon the junction between the two components, electron transfer takes place and generates a voltage which can then be used in any external circuit.

More specifically, the first component of this photocell is chosen from that group of organic materials which are classed as semiconductors. It has been found that those organics which possess the property of semiconductivity do so by virtue of the fact that their inter-atomic bonding system is composed primarily of pi-electrons as opposed to sigma bonding which characterizes the majority of organic compounds; the forces which bind together pi-electrons are such as to permit the excitation of those electrons upon reception of relatively low amounts of energy, thereby allowing comparatively rapid and free electron movement within the molecule itself and presumably between molecules as well and thus providing a system which is capable of transmitting an electric current upon suitable activation. Those organics which possess such a bonding system may be generally and broadly described as light absorptive dyes which are polynuclear homo and heterocyclic condensed ring compounds; perylene, decacyclene and the phthalocycanine are a few examples of the semiconducting materials which are suitable for use in this photocell.

The second component of this invention is any organic material capable of functioning as either an oxidizing or a reducing agent with respect to the semiconductor chosen as the first component, or which, in other words, is either an electron donor or an electron acceptor. Among the electron accepting materials which have been found suitable are oxidized tetramethyl p-phenylenediamine, $\beta$-carotene, dibrominated tetramethyl phenylenediamine, and p-chloranil. Electron donors, i.e., many of the well known organic reducing agents, are useful.

Thus it is seen that the photocell of this invention is comprised of two dissimilarly functioning materials, the first of which serves to conduct charge while the second serves to either give off or take on electrons. Upon the reception of light energy at the junction between these components, thereby making light available to both materials simultaneously, an oxidation-reduction system is set up; the resultant electron movement, therefore, is responsible for establishment of a voltage.

To insure efficient electron transfer however it is necessary to provide for intimate contact between the two components of this photocell. This may be conveniently accomplished by first reducing the semiconductor material, which is a solid at room temperature, to a fine powder and compressing this powder into a small disc or other thin and flat compact form by means of a die or other suitable shaping instrument. The first component thus presents a smooth and flat surface for reception of the second component which is best applied as a thin film to this surface. This may be done by preparing a solution or dispersion of the oxidizing or reducing agent in a volatile organic solvent, spreading this mixture over one surface of the semiconductor material and allowing the solvent to escape by evaporation. In this manner, the two components of this photocell are made to closely adhere to each other, and by virtue of its thinness light is allowed to pass through one component, in this case the film, and thus impinge on the junction between these materials.

In order to utilize the current which is generated by the action of light on this cell, it is necessary to establish electrical contact with each face of this cell and to provide lead wires to convey the currents to external circuitry; it should be pointed out however that the above adjuncts must not interfere with the reception of light by this photocell. To accomplish this, at least one of the electrical contacts used must have the property of transmitting light as well as being conductive; for this purpose, the conducting glass electrode has proved very satisfactory as this latter structure may be formed so as to provide contact with any desired amount of surface area of one component of this cell without hindering the passage of light through this component.

The direction of the current flow is determined by the electron donating or accepting property of the second component, the flow being toward the second component if this is an electron acceptor and away from this component if a donor, while the maximum voltage which can be developed by this photocell is a function of the electrical properties of both components and of the radiant energy incident on the junction between them.

The following description of the preparation of one organic photocell according to the foregoing principles may better serve to illustrate the present invention.

*Example*

The first component of this photocell was prepared by reducing a small quantity of an organic semiconductor, in this instance purified magnesium phthalocyanine, to a powder and then compressing this powder in a die to form a disc 1.5 cm. in diameter and 0.1 cm. thick.

To make this disc photovoltaic, the second component, which may be either an oxidizing or reducing agent, is best applied as a thin coating or film. For this particular photocell, an acetone solution of an oxidizing material, air-oxidized tetramethyl p-phenylenediamine, was evaporated from one of the two flat surfaces of this disc. It was previously pointed out that the second component must act as either an oxidizing or reducing agent with respect to the semiconductor which is employed; previous experimentation showed that the oxidized rather than the non-oxidized form of this amine was necessary to perform the function of an oxidizing agent in combination with magnesium phthalocyanine. Electrical contacts were provided for this photocell by pressing the amine-coated side of the disc in contact with a conducting glass electrode, positioning this electrode-disc combination along with suitable electrical leads in insulation within a glass windowed moisture-free vacuum chamber and holding the electrode against the window by the application of a stainless steel piston to the opposite side of the disc. During measurements a mechanical pressure of 9 kg./cp.$^2$ held the disc against the glass and a gas pressure of $10^{-4}$ mm. Hg was maintained; the operation of this photocell was observed under vacuum and in the absence of moisture in order to eliminate those variables which could affect the operation of this photocell.

Light from a 500 watt projection lamp was passed through the chamber window and glass electrode to illuminate the junction between the disc and coating, and a vibrating reed electrometer was used to measure the photovoltage, photoconductivity and resistance of this cell. Under the above specified conditions this photocell developed a maximum voltage of 200 mv. and a power output of $3\times10^{-12}$ watts. This power output appeared to be limited by an internal cell resistance of $10^8$ ohms and by the maximum radiant energy incident on the junction. The magnesium phthalocyanine layer was at a positive potential with respect to the oxidized tetramethyl p-phenylenediamine layer, indicating electron transfer from the semiconductor to the electron accepting layer.

The above sample will serve to illustrate the basic model of this organic photocell. Essentially similar results have been obtained with the following combination of semiconductors and oxidizing agents (electron acceptors) respectively: magnesium phthalocyanine and beta-carotene, magnesium phthalocyanine and dibrominated tetramethyl phenylenediamine, nickel phthalocyanine and dibrominated tetramethyl phenylenediamine, decacylene and dibrominated tetramethyl phenylenediamine, perylene and p-chloranil, coronene and c-chloranil.

Thus it will be seen that it is possible to create units, multiples of those described in the examples, with a variety of different materials and, because of their intrinsic properties and characteristics large areas of such collectors are made very cheaply. The lattice of the organic molecules used is an organic molecular lattice as compared with the more common inorganic atomic lattice. In general the organic molecules may be characterized as large flat planar molecules providing the basic lattice. Such a molecule in general will belong in the classification designated aromatic compounds, the simplest of which, of course, is benzene. Useful for purposes of the invention, because of reduced volatility and planar characteristics are naphthalene anthracene, phenanthrene, pyrene, perylene and on up the scale to coronene, violanthrene, etc. with graphite representing an ultimate extreme.

Molecules based on such a lattice invariable crystallize in layer type structures because of the very great dissymetry of the molecule and, because the molecules are large flat planes, they crystallize in a manner such as to have the planes lying one on the other, generally parallel to each other. Because of this natural configuration of the molecules it is not necessary to grow single crystals of the substances to get these large molecules oriented parallel to each other in layers. At least the two dimensional orientation comes natural. Accordingly, this 2-dimensional lattice having the planar molecules lying parallel to each other is achieved when the dry organic material is sublimed, precipitated or crystallized from solvent.

Such large aromatic molecules are so arranged as to have electronic orbitals overlap each other and produce semi-conductors. In accordance with our invention we form a system for generating the electricity by adding the positive and negative carriers required to produce the n–p junction needed for conversion of solar radiation.

We have found that suitable electron donors interact with such flat aromatic systems to transfer electrons from the donor to the aromatic semi-conductor crystal. When this happens the residual electron donor thus constitutes the positive hole. A typical example of such an organic electron donor is tetramethyl-p-phenylenediamine. Other electron donors which themselves have a planar charge, are useful; for example, suitable hydroquinones, or hydroquinone ethers and sulfur compounds.

A wide variety of electron acceptors similarly is available including the quinones in particular. These molecules have a tendency to accept electrons and if allowed to come in contact with the donors they do accept one or two electrons from the donor and the reaction thereby goes to completion. By suitably treating the matrix of the semi-conductor hydrocarbon with a suitable electron donor, and an electron acceptor, the n–p junction is produced with these two agents frozen in place and separated from each other so that no irreversible reaction can take place by direct action between them, but only through the electron conduction system of the semiconductor matrix into which they are placed.

Accordingly, it will be seen that upon setting up such a cell, absorption of light will set up a potential difference corresponding to the nature of the electron donor, the electron acceptor, and the matrix in which they are placed. FIGURE 1 is a section through a cell built in accordance with this invention. As shown in the drawing when electrodes are placed on the side of such an electron donor-acceptor-matrix 100—100[1] it is possible to draw off a current for useful purposes through electrodes 101 and 102. It is desirable that electrode 102 or 101 be transparent to permit impingement of light on a surface of the cell. Close contact between electrodes can be had by having electrode 102 compressed against window 103 by cylinder 104. However, sealing the donor-acceptor-matrix wafer into a plastic transparent capsule is also a useful way of constructing the device.

Though the invention has been described with reference to only a limited number of examples it is to be understood that variants thereof may be produced without departing from its spirit or scope.

What is claimed is:

1. A photoelectric cell comprised of an organic semiconductor, having primarily a pi electron bonding system, and an organic material selected from the group consisting of electron acceptors and electron donors, said semiconductor and organic material being in contact with each other so as to form an electron transferring boundary.

2. A photoelectric cell comprised of a first and a second component held in intimate contact to form an electron transferring boundary, the first component being an organic semiconductor having primarily a pi electron bonding system, the second component being selected from the group consisting of electron acceptors and electron donors.

3. A photoelectric cell responsive to illumination which cell is comprised of a first and a second component held in intimate contact to form an electron transferring boundary, the first component being an organic semiconductor having primarily a pi electron bonding system, the second component being selected from the group consisting of organic compounds which are electron acceptors and electron donors, said first and second component being in an arrangement to form a junction whereby the junction between said first and second components can be illuminated.

4. A cell in accordance with claim 3 wherein the first component is magnesium phthalocyanine and the second component is beta-carotene.

5. A cell in accordance with claim 3 wherein the first component is magnesium phthalocyanine and the second component is dibrominated tetramethyl phenylenediamine.

6. A cell in accordance with claim 3 wherein the first component is nickel phthalocyanine and the second component is dibrominated tetramethyl phenylenediamine.

7. A cell in accordance with claim 3 wherein the first component is decacyclene and the second component is dibrominated tetramethyl phenylenediamine.

8. A cell in accordance with claim 3 wherein the first component is perylene and the second component is p-chloranil.

9. A cell in accordance with claim 3 wherein the first component is coronene and the second component is c-chloranil.

References Cited in the file of this patent

Eley, Research (London), vol. 12, Aug./Sept. 1959, pp. 293–299.